United States Patent
Schütze

[11] Patent Number: 5,542,230
[45] Date of Patent: Aug. 6, 1996

[54] CONNECTING RODS

[75] Inventor: Rainer Schütze, Brunswick, Germany

[73] Assignee: Deutsche Forschungsanstalt f. Luft-und Raumfahrt e.V., Cologne, Germany

[21] Appl. No.: 218,064

[22] Filed: Mar. 25, 1994

[30] Foreign Application Priority Data

Apr. 2, 1993 [DE] Germany ............... 43 10 825.3

[51] Int. Cl.⁶ .................................................. E04C 3/29
[52] U.S. Cl. ...................... 52/726.1; 403/28; 403/404
[58] Field of Search ..................... 52/645, 646, 726.1; 403/28, 29, 30, 31, 404

[56] References Cited

U.S. PATENT DOCUMENTS

| | | |
|---|---|---|
| 2,813,733 | 11/1957 | Herrmann et al. |
| 4,294,559 | 10/1981 | Schutzler ........................ 403/28 |
| 4,697,499 | 10/1987 | Dirkin et al. |
| 4,991,991 | 2/1991 | Ito et al. ........................ 403/30 |
| 5,134,812 | 8/1992 | Hoffman et al. ........................ 403/404 |

FOREIGN PATENT DOCUMENTS

| | | |
|---|---|---|
| 501658 | 2/1992 | European Pat. Off. |
| 4029008 | 9/1990 | Germany. |
| 2247930 | 3/1992 | United Kingdom. |

OTHER PUBLICATIONS

*Smart Structures For Aircraft and Spacecraft;* 5th–7th Oct. 1992; Mohan S. Misra, Bernie Carpenter and Brian Maclean.

*Primary Examiner*—Michael Safavi
*Attorney, Agent, or Firm*—Salter & Michaelson

[57] ABSTRACT

A rod with a tubular wall made from carbon fibre composite material and having connecting elements arranged at both ends. The tubular wall is divided in the center of the rod and an actively controllable pressure element, which acts in the axial direction of the rod, is built into the rod and lies against the inner faces of thrust washers, whilst the end faces of the divided tubular wall rest against the outer faces of the washers. Over the region of the element on the outer face of the tubular wall there is disposed a sleeve which engages over and is glued to the adjacent ends of the rod.

11 Claims, 1 Drawing Sheet

CONNECTING RODS

The present invention relates to a connection rod and more particularly to a rod with a tubular wall made from carbon fibre composite material and having a respective connecting element arranged at each end.

One such rod has a tubular wall made from carbon fibre composite material on a core of foam material with at least one layer of axially parallel unidirectional fibres and a fabric hose lying above it. The fibres cross at an angle to the axis of the rod, which is provided at both ends with a connection fitting for the axial introduction of tensions and/or pressures. Each connection fitting is provided with a rotationally symmetrical connecting element with a coaxial internal thread into which can be screwed a connecting screw element which can be secured against turning by a lock nut, and which is provided with an annular shoulder against which the unidirectional fibres lie end-on in each case in the region of the connecting element.

In rods of this type the pressures are directly transferred in a positive or form-locking manner by means of the axially parallel unidirectional fibres which rest end-on at both ends against an annular shoulder of the connection fitting, and thus a high coefficient of elongation of the rods is achieved. The tensions are transferred by form locking or force locking between the rotationally symmetrical connecting elements and the unidirectional fibres (DE 40 29 008 C1). Rods of the above type are used for example as pressure-resistant and tension-resistant actuating rods. However, they are also used in the erection of plane or three-dimensional lattice structures.

Structures which can react actively to external strains, so-called adaptive structures, are increasingly gaining in importance in many spheres of technology. They are capable of determining their current structural shape by way of corresponding sensors and of altering this shape in a defined manner by means of actuators. This ability can be important, for example, in order to be able to counteract disrupting vibrations of the structure or to suppress them from the outset.

SUMMARY OF THE INVENTION

The present invention seeks to provide a rod element with which adaptive lattice structures can be produced.

According to a first aspect of the present invention, there is provided a rod with a tubular wall made from carbon fibre composite material on a core of foam material with at least one layer of axially parallel unidirectional fibres and a fabric hose lying above it with fibres crossing at an angle to the axis of the rod, said rod being provided at each end thereof with a respective connection fitting for the axial introduction of tensions and/or pressures, wherein each said connection fitting is provided with a rotationally symmetrical connecting element with a coaxial internal thread and an annular shoulder, said unidirectional fibres lying end-on against said annular shoulder of each said connection fitting, wherein an actively controllable pressure-producing element acting in the axial direction of said rod is built in between the ends of said rod and a respective thrust washer is provided at each end of said pressure-producing element, each said thrust washer having an inner face and an outer face, said pressure producing element resting at each end thereof against said inner face of a respective one of said thrust washers, said unidirectional fibres of said tubular wall of said rod being divided in the region of the pressure-producing element to define intermediate end faces, said intermediate end faces resting against said outer faces of said thrust washers, and over said region on the exterior of said tubular wall there is disposed a sleeve, said sleeve engaging over said intermediate end faces and said sleeve being glued to said rod and being constructed for the take-up of tensions.

According to a second aspect of the present invention, there is provided a rod made from fibres and including between its ends an actively controllable axial pressure-producing element, each end of said element being separated from said fibres of said rod by a respective thrust washer, said element being surrounded by a relatively elastic sleeve, said sleeve being adhered to the exterior of said rod adjacent to said element.

BRIEF DESCRIPTION OF THE DRAWINGS

A preferred embodiment of the present invention will now be described, by way of example only, with reference to the accompanying drawings, of which:

FIG. 2 shows, on an enlarged scale, the central region which is enclosed by dash-dot lines in FIG. 1.

DESCRIPTION OF THE PREFERRED EMBODIMENT

Figure 1:
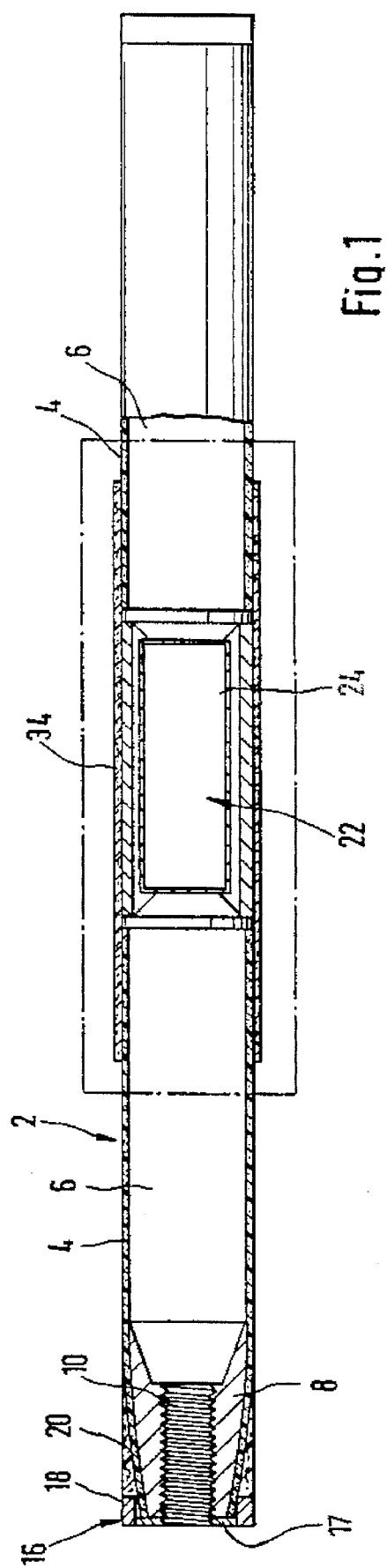
FIG. 1 shows partially in longitudinal section a rod constructed according to an embodiment of the invention.

Basically according to a first aspect the present invention provides a rod with a tubular wall made from carbon fibre composite material on a core of foam material with at least one layer of axially parallel unidirectional fibres and a fabric hose lying above it with fibres crossing at an angle to the axis of the rod, which is provided at both ends with a connection fitting for the axial introduction of tensions and/or pressures, wherein the connection fitting is provided with a rotationally symmetrical connecting element with a coaxial internal thread into which can be screwed a connecting screw element which can be secured against turning by a lock nut, and which is provided with an annular shoulder against which the unidirectional fibres lie end-on in each case in the region of the connecting element, wherein an actively controllable pressure-producing element which acts in the axial direction of the rod is built in between the ends of the rod and rests at both ends against the inner faces of thrust washers and the end faces of the unidirectional fibres of the tubular wall of the rod which is divided in this region rest against the outer faces of the thrust washers, and over the region of the actively controllable element on the outer face of the tubular wall there is disposed a sleeve which engages over the adjacent ends of the rod, is glued thereto and is constructed for the take-up of tensions.

Basically according to a second aspect the present invention provides a rod made from fibres and including between its ends an actively controllable axial pressure-producing element separated from the fibres of the rod by thrust washers, said element being surrounded by a relatively elastic sleeve adhered to the adjacent portions of the rod.

Referring now to the drawings, the rod 2 shown in FIG. 1 has a tubular wall 4 made from carbon fibre composite material on a core 6 made from a pressure-resistant foam material. The tubular wall 4 contains at least one layer of axially parallel unidirectional fibres and a fabric hose lying above it with fibres which cross at an angle to the axis of the rod 2. On the ends of the rod are arranged connection fittings of which only those elements which are necessary for understanding are shown in the drawings.

Each fitting is a rotationally symmetrical connecting element 8 which is provided with a coaxial threaded bore 10 and externally has a conical portion which tapers towards the end of the rod. The axially parallel unidirectional fibres lie over the entire length of the conical portion of the connecting element 8 against the surface thereof. These fibres extend to over the outer end of the connecting element 8. At their end face a thrust washer 16 lies against them. The thrust washer 16 includes an annular flange portion 17 and has a collar 18 which engages over the end of the tubular wall 4. The axially parallel unidirectional fibres of wall 4 abut against the inner surface of the flange portion 17 of the washer 16. At least in the conical region a peripheral winding 20 made from high-strength carbon fibres is embedded in a plastics matrix with which the fibres are pressed in a form-locking manner against the conical surface region of the connecting element 8.

A connecting element can be screwed in the usual way into the threaded bore 10, and can be secured against turning by a lock nut which in turn acts against the thrust washer 16.

The tubular wall 4 is divided, preferably centrally thereof, between the ends of the rod and there is built into the rod 2 an actively controllable pressure-producing element 22 which acts in the axial direction and with which the length of the rod 2 can be altered in a defined manner. Due to this element the rod 2 acquires adaptive properties. The distributions of force in a lattice structure can be optimally adjusted by active regulation of the rod lengthen. However, by means of the element 22, forces can also be introduced into such a lattice structure which for example counteract disruptive vibrations of the structure. In this case the element 22 should be constructed to be as fast-acting as possible, so that such vibrations can be counteracted even as they occur.

The element 22 can for example be a piezoelectric element 24 with a stack of piezoelectric members with electrical connections, as assumed in the present embodiment. A piezoelectric element 24 can be altered in length depending upon an applied voltage.

This piezotranslator 24 is disposed between two thrust washers 26, the external diameter of which corresponds to the external diameter of the tubular wall 4 of the rod 2. The end faces of the tubular wall 4 rest against the outer faces of these thrust washers 26 facing away from the piezotranslator 24, so that here pressures are introduced directly into the thrust washers 26.

A cylindrical circular stiffening element 32, lying internally against the tubular wall 4, is disposed adjacent to the outer face of each thrust washer.

On the inner face of the thrust washers 26 there are provided projections 28 in the form of truncated cones and the piezotranslator 24 lies against the upper face thereof. The base of these projections 28 has a diameter which is smaller than the external diameter of these thrust washers 26, so that annular shoulders 30 are formed on the exterior. These annular shoulders 30 form stop surfaces for a pressure sleeve 31 made from carbon fibre composite material which is disposed around the piezotranslator 24. This pressure sleeve 31 is adapted with an undersize x which is chosen so that when predetermined pressures are exceeded in the axial direction the pressure sleeve 31 takes over the transfer of pressure between the thrust washers 26 and thus the piezotranslator 24, which is sensitive to high pressures, is relieved.

The two rod portions with the element 22 are connected to one another by way of an external sleeve or bush 34 made from carbon fibre composite material which is glued externally onto the adjacent ends of the rod 2. This bush 34, which contributes to the transfer of tensions, has a relatively low coefficient of elongation, so that the desired alterations in length of the rod 2 can be carried out by way of the element 22. This can be achieved by a small thickness of the bush walls, but also by the use of fibres with a low modulus of elasticity. Since the resistance to tension of unidirectional carbon fibre composite material layers is generally substantially higher than the resistance thereof to pressure, a thin tension sleeve with relatively high elasticity will also have sufficient strength.

For measurement of the pressures which are manifested inter alia in the form of alterations in length of the bush 34, the bush 34 can be equipped externally with strain measuring devices, such as strain measurement strips 36 or also glass fibres of optoelectronic strain gauges.

The connections of the piezotranslator 24 can be passed axially through one of the thrust washers 26 and guided outwardly, preferably in the region of the gluing of the overlap between the bush 34 and the rod 2.

Instead of a piezotranslator 24, other elements 22 can also be used which have a small installation volume and with which high alterations in pressure can be produced. For example these elements 22 could be based on shape memory alloys. It is essential that the low weight of the structure, which is typical for rods 2 of the present type, is increased as little as possible by the elements 22.

It will be understood that the above description of the present invention is susceptible to various modifications, changes and adaptations.

What is claimed is:

1. A rod comprising a core of foam material and a tubular wall made from carbon fiber composite material, said tubular wall including at least one layer of axially parallel unidirectional fibers, said tubular wall further including a fabric hose lying above said at least one layer, said fabric hose having fibers crossing at an angle to an axis of the rod, said rod being provided at each end thereof with a respective connection fitting for the introduction of an axial force, wherein each of said connection fittings is provided with coaxial internal thread and an external annular shoulder, said unidirectional fibers lying end-on against said annular shoulder, said rod further comprising an actively controllable pressure-producing element operable for acting in an axial direction of the rod, said pressure-producing element being positioned between the respective ends of the rod, wherein a respective thrust washer is provided at each end of the pressure-producing element, each of said thrust washers having an inner face and an outer face, said pressure producing element resting at each end against an inner face of a respective one of said thrust washers, said tubular wall of said rod being divided between its ends to define intermediate end faces, said intermediate end faces resting against said outer faces of said thrust washers, said rod still further comprising a sleeve disposed over the exterior of the tubular wall, said sleeve extending over said pressure-producing element and said intermediate end faces, said sleeve being glued to said rod and being constructed for the take-up of tensions.

2. The rod of claim 1 wherein said pressure-producing element comprises a piezoelectric element, and a length of said piezoelectric element can be altered by an applied voltage.

3. The rod of claim 2 further comprising a cylindrical pressure sleeve received around the piezoelectric element and between the respective inner faces of said thrust washers, said pressure sleeve being made from carbon fiber composite material and having a length which is slightly less than an axial distance measured between the respective inner faces of said thrust washers.

4. The rod of claim 1 wherein said pressure-producing element comprises a body based on shape memory alloys.

5. The rod of claim 1 further comprising a stiffening element, said stiffening element comprising a cylindrical ring which lies internally against said tubular wall and is disposed adjacent to each of said intermediate end faces of said rod.

6. A rod comprising a core of foam material and a tubular wall made from carbon fiber composite material, said tubular wall including at least one layer of axially parallel unidirectional fibers, said tubular wall further including a fabric hose lying above said at least one layer, said fabric hose having fibers crossing at an angle to an axis of the rod, said rod being provided at each end thereof with a respective connection fitting for the introduction of an axial force, said rod further comprising an actively controllable pressure-producing element operable for acting in an axial direction of the rod, said pressure-producing element being positioned between the respective ends of the rod, wherein a respective thrust washer is provided at each end of the pressure-producing element, each of said thrust washers having an inner face and an outer face, said pressure producing element resting at each end against an inner face of a respective one of said thrust washers, said tubular wall of said rod being divided between its ends to define intermediate end faces, said intermediate end faces resting against said outer faces of said thrust washers, said rod still further comprising a sleeve disposed over the exterior of the tubular wall, said sleeve extending over said pressure-producing element and said intermediate end faces, said sleeve being glued to said rod and being constructed for the take-up of tensions.

7. The rod of claim 6 wherein said pressure-producing element comprises a piezoelectric element, and a length of said piezoelectric element can be altered by an applied voltage.

8. The rod of claim 7 further comprising a cylindrical pressure sleeve received around the piezoelectric element and between the respective inner faces of said thrust washers, said pressure sleeve being made from carbon fiber composite material and having a length which is slightly less than an axial distance measured between the respective inner faces of said thrust washers.

9. The rod of claim 6 wherein said pressure-producing element comprises a body based on shape memory alloys.

10. The rod of claim 6 further comprising a stiffening element, said stiffening element comprising a cylindrical ring which lies internally against said tubular wall and is disposed adjacent to each of said intermediate end faces of said rod.

11. The rod of claim 6 wherein each of said connection fittings is provided with coaxial internal thread and an external annular shoulder, said unidirectional fibers lying end-on against said annular shoulder.

* * * * *